US007006564B2

(12) United States Patent
Ling et al.

(10) Patent No.: US 7,006,564 B2
(45) Date of Patent: Feb. 28, 2006

(54) ADAPTIVE EQUALIZER

(75) Inventors: Stanley K. Ling, Rocklin, CA (US); Hiroshi Takatori, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 725 days.

(21) Appl. No.: 09/930,757

(22) Filed: Aug. 15, 2001

(65) Prior Publication Data

US 2003/0048840 A1  Mar. 13, 2003

(51) Int. Cl.
 H03K 5/159 (2006.01)
(52) U.S. Cl. ..................... 375/232; 708/323
(58) Field of Classification Search ........... 375/233, 375/14, 94, 101, 232, 99, 262, 341, 343, 375/348, 349, 261, 340; 333/28 R; 371/43; 364/724.2; 348/607; 714/794–796, 791, 714/786, 752; 708/323
See application file for complete search history.

(56) References Cited

U.S. PATENT DOCUMENTS

| 4,905,254 | A | * | 2/1990 | Bergmans | 375/233 |
|---|---|---|---|---|---|
| 5,031,195 | A | * | 7/1991 | Chevillat et al. | 375/234 |
| 5,150,379 | A | * | 9/1992 | Baugh et al. | 375/232 |
| 5,436,929 | A | * | 7/1995 | Kawas Kaleh | 375/233 |
| 6,011,814 | A | * | 1/2000 | Martinez et al. | 375/233 |
| 6,012,161 | A | * | 1/2000 | Ariyavisitakul et al. | 714/795 |
| 6,118,814 | A | * | 9/2000 | Friedman | 375/232 |
| 6,167,082 | A | * | 12/2000 | Ling et al. | 375/233 |
| 6,289,046 | B1 | * | 9/2001 | Takeuchi et al. | 375/232 |
| 6,414,990 | B1 | * | 7/2002 | Jonsson et al. | 375/232 |
| 6,490,327 | B1 | * | 12/2002 | Shah | 375/341 |

OTHER PUBLICATIONS

Adaptive equalization; Qureshi, S.; Communications Magazine, IEEE vol. 20, Issue 2, Mar. 1982 Pages(s):9-16.*
Edward A. Lee and David G. Messerschmitt, Digital Communication: Chapter 9: Adaptive Equalization, 1988, pp. 371-406, Kluwer Academic Publishers, Boston, MA, USA.
John G. Proakis, Digital Communications: Chapter 11: Adaptive Equalization, 1995, pp. 636-679, McGraw-Hill, Inc.
Bernard Widrow and Samuel D. Stearns, Adaptive Signal Processing: Chapter 12: Adaptive Interference Canceling, 1999, pp. 302-367, Prentice-Hall, Inc. USA.
Shahid U.H. Qureshi, "Adaptive Equalization", Proceedings of the IEEE, Sep. 1985, pp. 1349-1387, vol. 73, No. 9, USA.

\* cited by examiner

*Primary Examiner*—Temesghen Ghebretinsae
*Assistant Examiner*—Jacob Meek
(74) *Attorney, Agent, or Firm*—Kacvinsky LLC

(57) ABSTRACT

An adaptive equalizer processes an input signal that includes noise, pre-cursor intersymbol interference, and post-cursor intersymbol interference. The adaptive equalizer includes a feedforward filter which reduces the pre-cursor intersymbol interference and whitens the noise, a feedback filter which detects the post-cursor intersymbol interference in a signal that corresponds to the input signal, and circuitry which removes the detected post-cursor intersymbol interference from the input signal. The feedforward filter includes separate first and second coefficients. The first coefficients reduce the pre-cursor intersymbol interference and the second coefficients whiten the noise.

11 Claims, 3 Drawing Sheets

ADAPTIVE EQUALIZER

TECHNICAL FIELD

This invention relates to an adaptive equalizer for data communications.

BACKGROUND

Information may be transmitted from a transmitter to a receiver over a communication channel, such as a satellite link, a fiber optic cable, or a copper cable. The information may include, e.g., analog voice information from a telephone conversation or digital data that is transmitted between two computers. Analog information is often transformed into a digital format before it is transmitted over a channel.

The transmitted information may be encoded into a sequence of symbols selected from a set of pre-defined symbols, known as an alphabet. Each of the symbols is represented by an electronic pulse, which is transmitted over the communication channel to a remote location. The sequence of pulses forms a signal that is received by the receiver. The receiver retrieves the symbols from the signal and decodes them to recover the transmitted information.

Communication channels typically distort the pulses as they are transmitted through the channels. The channels may add noise to the pulses. Certain types of additive noise, known as white noise, are evenly distributed at all frequencies. Thermal noise from copper wires is typically a source of white noise. Other types of additive noise, known as colored noise, may be concentrated at certain frequencies. Signals induced on a wire by an adjacent wire, which is known as crosstalk, are a typical source of colored noise.

The channel may also distort the amplitude or phase of the transmitted signals. As a result of this distortion, the pulses representing the symbols may be corrupted with information from other pulses in the sequence. The corruption is referred to as inter-symbol interference (ISI). There are two kinds of ISI. A pulse representing a particular symbol may be corrupted with information from an earlier pulse in the sequence. This is known as post-cursor ISI. Alternatively, the pulse may be corrupted with information from a future pulse in the sequence. This is known as pre-cursor ISI.

The receiver typically has a signal detector to detect symbols received from the channel. The detector may, for example, be in the form of a simple threshold detector or a maximum likelihood sequence decoder. The detector is typically optimized to detect symbols that have only been distorted by additive white Gaussian noise (AWGN). Consequently, colored noise and/or inter-symbol interference may cause errors when the symbols are detected.

DESCRIPTION

Figure 1:
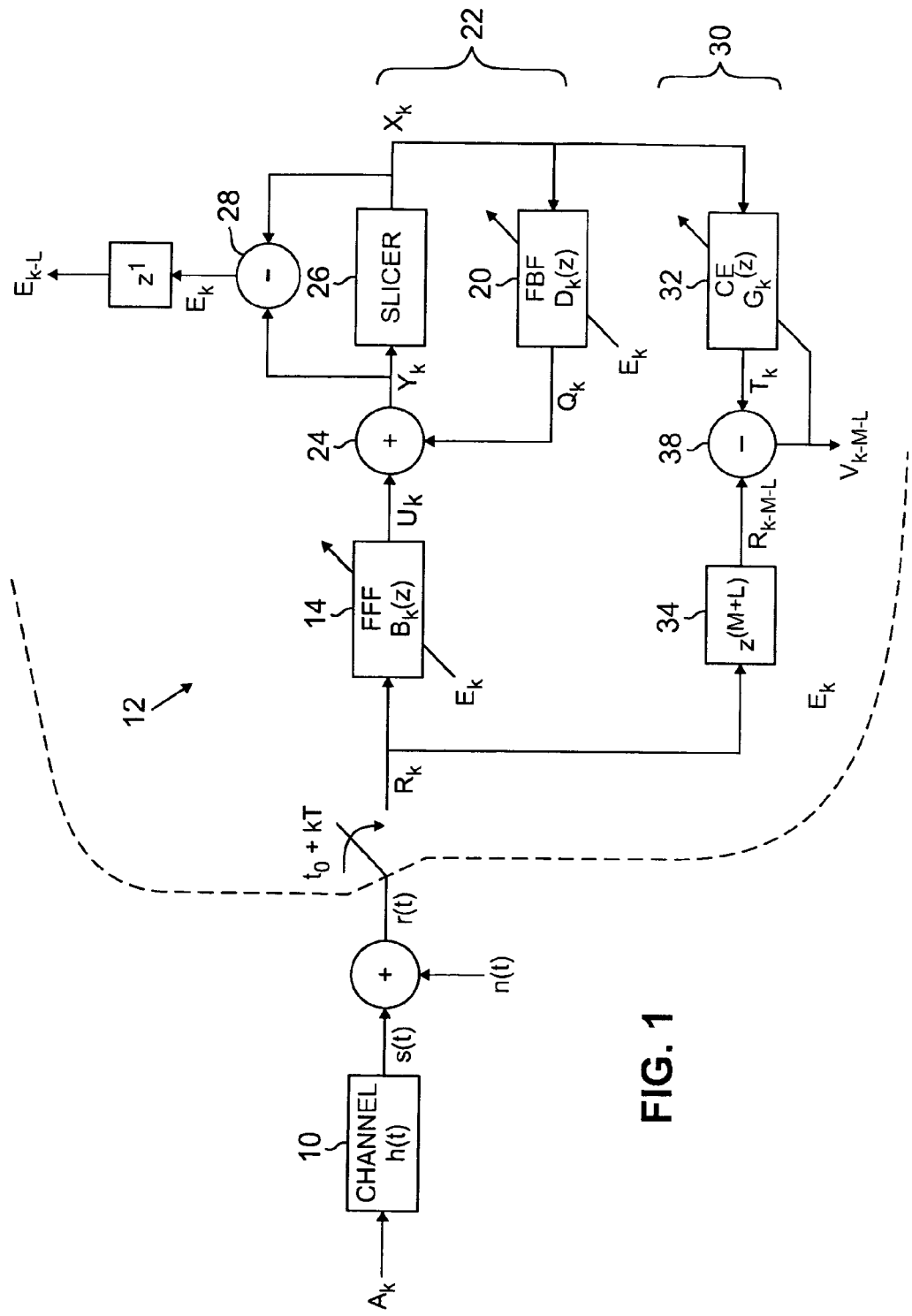
FIG. 1 is a block diagram of an adaptive decision feedback equalizer (DFE).

FIG. 1 shows a block diagram of a channel (h(t)) 10 and an adaptive DFE 12. A signal $A_k$, comprised of a sequence of symbols, is transmitted over channel 10 to adaptive DFE 12. The resulting signal s(t) contains both pre-cursor and post-cursor ISI. Crosstalk, comprised of colored noise n(t), is added to s(t) during transmission. Colored noise (also referred to as "colored Gaussian noise") is noise that varies over a range of frequencies. By contrast, white noise (also referred to as "white Gaussian noise") is noise that is substantially the same over a range of frequencies.

Figure 2:
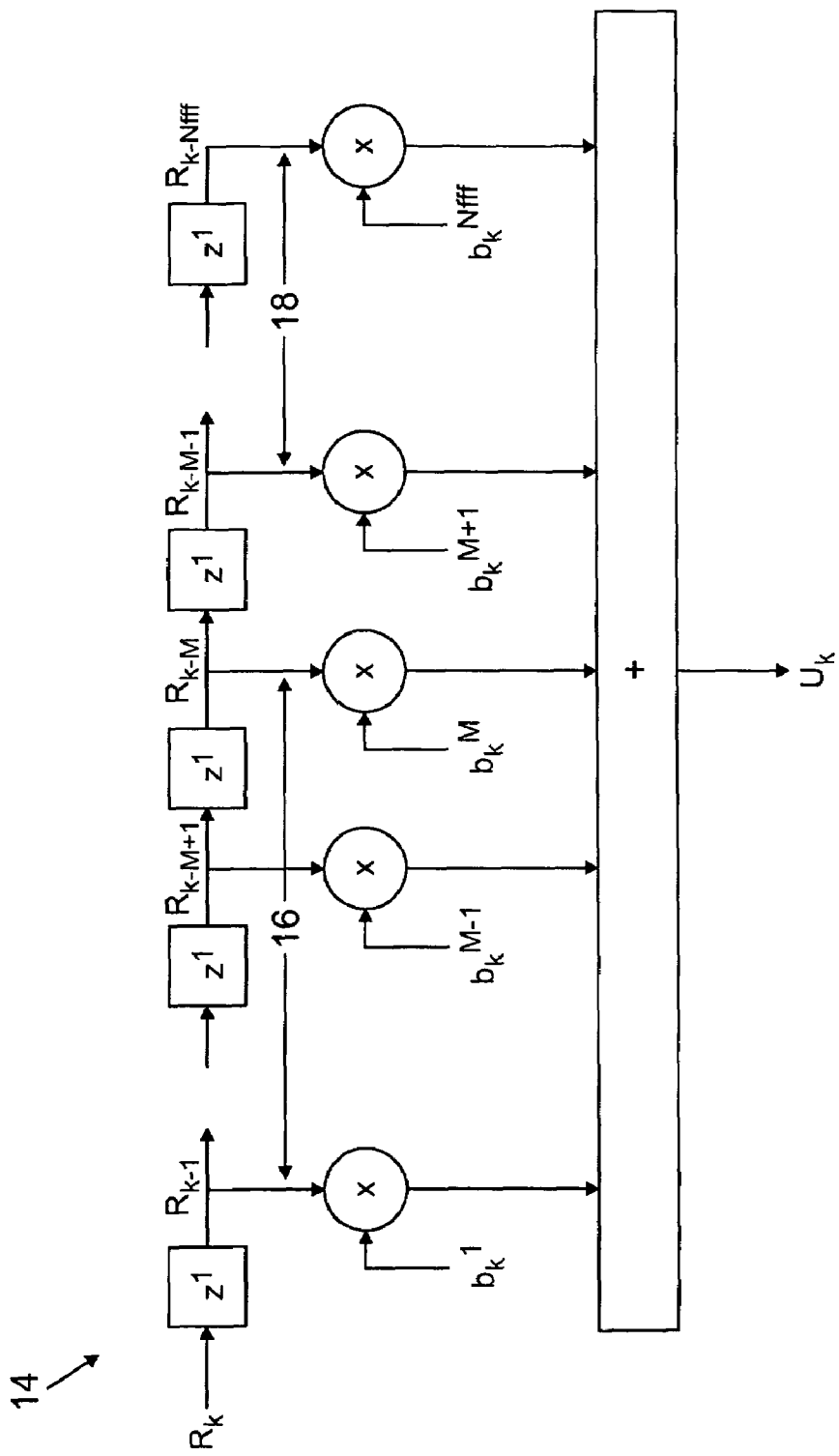
FIG. 2 is a block diagram of a feedforward filter in the adaptive DFE.

The combination of s(t) and n(t), namely r(t), is sampled by adaptive DFE 12 at a sampling rate of $t_0+kT$ to produce a discrete time signal $R_k$, where to accounts for the channel delay and sampler phase. $R_k$ is applied to feedforward filter (FFF) 14, which produces an output signal $U_k$. In this embodiment, FFF 14 is finite impulse response (FIR) filter that contains a number $N_{fff}$ ($N_{fff} \geq 1$) of taps. Among the $N_{fff}$ taps is a main tap, M ($1 \leq M \leq N_{fff}$), which is roughly at the center of the taps. FIG. 2 shows a block diagram of FFF 14.

For the purposes of this description, the taps of FFF 14 are divided into two sets, taps 16 (comprised of the taps from 1 to M) and taps 18 (comprised of the taps from M+1 to $N_{fff}$). Taps 16 contain coefficients $b_k^i$ (for i=1 to M) that are used by FFF 14 to reduce pre-cursor ISI in $R_k$. Taps 18 contain different coefficients $b_k^i$ (for i=M+1 to $N_{fff}$) that are used by FFF 14 to whiten the noise in $R_k$, where the noise is n(t) (sampled, $n_k$) Taps 18 do not necessarily reduce post-cursor ISI in $R_k$. To whiten the noise, the coefficients on taps 18 reduce the differences in noise $n_k$ over the range of frequencies defined by the sampler's Nyquist frequency, kT/2. A description of how the coefficients, $b_k^i$, are generated is provided below.

The output of FFF 14, namely $U_k$, contains reduced pre-cursor ISI and whitened noise. FBF 20 reduces post-cursor ISI in the output of adaptive DFE 12. In this embodiment, FBF 20 is an FIR filter that contains a number $N_{fbf}$ ($N_{fbf} \geq 1$) of taps. The hardware shown in the block diagram of FIG. 2 may also be used to construct FBF 20. Taps in FBF 20 contain coefficients $d_k^i$ (for i=1 to $N_{fbf}$) that are used by FBF 20 to reduce post-cursor ISI in $U_k$. A description of how the coefficients, $d_k^i$, are generated is provided below.

The feedback loop 22 that includes FBF 20 works as follows. The output of FBF 20, namely $Q_k$, is provided to circuit junction 24, which adds $Q_k$ to $U_k$. The resulting signal $Y_k$ contains relatively little post-cursor ISI (since the post-cursor ISI, $Q_k$, is removed from $U_k$). The signal $Y_k$ is applied to slicer 26, which makes symbol (e.g., bit) decisions based on the content of $Y_k$. For example, slicer 26 may determine that a signal having a value that is greater than "0.0" constitutes a "1" bit and that a signal having a value that is less than "0.0" constitutes a "0" bit.

If correct bit decisions are made by slicer 26, the resulting signal $X_k$ will be a replica of $A_k$. That is, $X_k$ will be the same as the original data signal $A_k$, meaning that $X_k$ has no crosstalk noise, pre-cursor ISI, or post-cursor ISI. The difference, or error, between the ideal signal and the received signal is determined by taking the difference of $X_k$ and $Y_k$ using circuit junction 28. As described in more detail below, the error, Ek, is used to adaptively determine the coefficients $b_k^i$ for FFF 14 and the coefficients $d_k^i$ for FBF 20.

The output $X_k$ of slicer 26 is also applied to feedback loop 30. Feedback loop 30 contains a channel estimator (CE) 32. CE 32 filters $X_k$ to estimate the ISI added by channel 10. In this embodiment, CE 32 is an FIR filter with z-domain response, $G_k(Z)$. CE 32 performs the appropriate filtering on $X_k$, resulting in signal $T_k$, which corresponds to an estimate of the signal component of $R_k$ delayed in time. The amount of the delay is equal to the delay (M+L), where delay M corresponds to the delay through FFF 14, circuit junction 24, and slicer 26, among other components (not shown), and delay L corresponds to the number of precursor samples to be replicated by CE block 32.

To obtain an estimate, V, of the noise ($n_k$), adaptive DFE 12 obtains the difference between $T_k$ and a delayed version of $R_k$. Delay circuit 34 ($Z^{(M+L)}$) delays $R_k$ by the delay through adaptive DFE 12, namely M, and an amount L, which corresponds to the number of precursor samples to be replicated by CE 32. $T_k$ is the estimate of the signal component of $R_{k-M-L}$. Circuit junction 38 subtracts $T_k$ from the delayed version of $R_k$, namely $R_{k-M-L}$. The resulting signal, $V_{k-M-L}$, is an estimate of the noise $n_k$. $V_{k-M-L}$ is referred to as an "estimate", rather than a measurement of the actual noise, because the value of $T_k$ may not exactly match the signal component of $R_{k-M-L}$.

Described below are examples of ways of generating filter tap coefficients for FFF 14 and FBF 20. In this regard, prior art processes for generating pre-cursor and post-cursor tap coefficients for FFF 14 generated both types of coefficients in the same manner. Thus, in the prior art, the post-cursor taps of the FFF are designed both to whiten noise and to cancel post-cursor ISI. In a channel that introduces severe ISI and colored noise to a signal, such post-cursor taps generally prevent the FFF from adapting to an optimal weighted matched filter (WMF) solution.

By contrast, in adaptive DFE 12 described herein, the post-cursor taps of FFF 14 whiten noise, but are not designed to cancel post-cursor ISI (although some incidental cancellation of post-cursor ISI may occur). Consequently, the pre-cursor and post-cursor taps of FFF 14 are adapted using different least mean square (LMS) processes.

Referring to FIG. 1, adaptive DFE 12, and the equations that follow, are specified for a T-spaced adaptive DFE signal receiver utilizing a real, baseband modulation. To reiterate, in FIG. 1

| | |
|---|---|
| $A_k$: | represents transmit data symbols at time index k |
| s (t): | represents continuous time output of the channel h(t) at time t |
| n(t): | represents additive channel noise at time t |
| r(t): | represents continuous time receiver input at time t |
| $R_k$: | represents sampled receiver input at time index k |
| $U_k$: | represents the output of FFF 14 $B_k(z)$ at time index k |
| $Q_k$: | represents the output of FBF 20 $D_k(Z)$ at time index k |
| $Y_k$: | represents the equalized signal at time index k |
| $X_k$: | represents the recovered symbol at time index k |
| $E_k$: | represents the decision error ($X_k - Y_k$) at time index k |
| h(t): | represents the continuous-time channel impulse response. The channel is modeled as a continuous-time impulse response, h(t), with the signal peak at time $t_0$. |
| $B_k(z)$: | represents the z-domain response of FFF 14 at time index k |
| $D_k(z)$: | represents the z-domain response of FFF 14 at time index k |
| $V_k$ | represents the estimated noise at time index k |
| $T_k$ | represents the output of the CE $G_k(z)$ at time index k |
| $G_k(z)$ | represents the CE z-domain response at time index k |

To determine the coefficients, define $A_k$ to be a pulse amplitude modulation (PAM) sequence. The received signal r(t) thus constitutes the superposition of the impulse response of the channel h(t) and each transmitted symbol and the additive noise n(t). The noise may be either colored or white Gaussian noise. The received signal, r(t), is given as:

$$r(t) = \sum_i A_i h(t - iT) + n(t).$$

The received signal is sampled at instant $kT+t_0$ to generate $R_k$, where $t_0$ accounts for the channel delay and sampler phase:

$$R_k = A_k h(t_0) + \sum_{i \neq k} A_i h(t_0 + kT - iT) + n(t_0 + kT).$$

In this embodiment, FFF 14 is an FIR filter with z-domain response $$B_k(z) = \sum_{i=1}^{N_{fff}} b_k^i z^{-i},$$

where $N_{fff}$ is the number of tap coefficients in FFF 14, as defined above. FBF 20 is an FIR filter with z-domain response $$D_k(z) = \sum_{i=1}^{N_{fbf}} d_k^i z^{-i},$$

where $N_{fbf}$ is the number of tap coefficients in FBF 20, as also defined above.

For FIR filters, it is convenient to describe their operation in vector and matrix notation. Accordingly, we define the vector of FFF coefficients for adaptive DFE 12 as $$\underline{b}'_k = [b_k^1 \ldots b_k^M b_k^{M+1} \ldots b_k^{N_{fff}}],$$

where M is the main (or decision) tap of the FFF. A vector of past input samples to FFF 14 is defined as $$\underline{r}'_k = [R_{k-1} R_{k-2} \ldots R_{k-N_{fff}}].$$

The output of FFF 14, $U_k$, is thus equal to $$U_k = \underline{b}'_k \underline{r}_k.$$

We define the vector of coefficients for FBF 20 as $$\underline{d}'_k = [d_k^1 d_k^2 \ldots d_k^{N_{fbf}}]$$

and a vector of past input samples to FBF 20 as $$\underline{x}'_k = [X_{k-1} X_{k-2} \ldots X_{k-N_{fbf}}].$$

Assuming that slicer 26 makes correct decisions (i.e., $X_k$ is equal to $A_{k-M}$), then the output of FBF 20, $Q_k$, is equal to $$Q_k = \underline{d}'_k \underline{x}_k.$$

The output of adaptive equalizer 12, namely $Y_k$, is obtained by adding outputs of FFF 14 and FBF 20, as follows $$Y_k = U_k + Q_k.$$

The decision error, $E_k$, is equal to the difference of the recovered signal $X_k$ and the output $Y_k$ $$E_k = X_k - Y_k.$$

In this example, the decision error is equal to the true error, since correct decisions are assumed.

The LMS tap update equation for FBF 20 is $$d_k^i = d_{k-1}^i + \alpha \cdot E_k \cdot x_k^i,$$

where i is the tap index and a is the LMS step size of FBF 20. The LMS tap update equations for FFF 14 are:

$$b_k^i = b_{k-1}^i + \beta_1 \cdot E_k \cdot R_{k-1}, \; i=1, \ldots, M$$

$$b_k^i = b_{k-1}^i + \beta_2 \cdot E_k \cdot V_{k-1-L}, \; i=M+1, \ldots, N_{\mathit{ff}}$$

where i is the tap index and $\beta_1$ and $\beta_2$ are the LMS step sizes of FFF 14.

Adaptive DFE 12 generates the noise estimate $V_k$ by subtracting a replica of the signal $R_k$ from a delayed version of that signal plus noise. The signal replica is constructed by filtering $X_k$ using CE 32. CE 32, as noted, is an FIR filter with the following z-domain response $$G_k(z) = \sum_{i=1}^{N_{ce}} g_k^i z^{-i},$$

where $N_{ce}$ is the number of tap coefficients in the CE.

We define the vector of coefficients for CE 32 as $$g_k' = \lfloor g_k^1 g_k^2 \ldots g_k^{N_{ce}} \rfloor$$

and a vector of past input samples to CE 32 as $$x_{CE_k}' = \lfloor X_{k-1} X_{k-2} \ldots X_{k-N_{ce}} \rfloor.$$

The output of CE 32, namely $T_k$, is thus equal to $$T_k = g_k' \cdot x_{CE_k}'.$$

The signal estimate $T_k$ is a delayed estimate of the signal component of $R_k$. $T_k$ is an estimate of the signal component of $R_{k-M-L}$. The estimate is delayed by M+L samples, where L, as noted above, is the number of precursor samples to be replicated by CE 32.

The output, $V_{k-M-L}$, of the CE summing node 38 is obtained by subtracting $T_k$ from $R_{k-M-L}$, as follows $$V_{k-M-L} = R_{k-M-L} - T_k.$$

$V_{k-M-L}$ contains both additive noise and a residual signal component. $V_{k-M-L}$ is thus a relatively accurate estimate of the additive noise when the number of CE taps is sufficient and the CE coefficients have been adapted to the channel.

The LMS process adaptively updates the CE coefficients. The tap update equations (in vector notation) for CE 32 are $$g_k = g_{k-1} + \gamma \cdot V_{k-M-L} \cdot x_{CE_k},$$

where $\gamma$ is the CE LMS step size.

The LMS step sizes of adaptive DFE 12 may be optimized with respect to its signal-to-noise ratio (SNR). The LMS step sizes $\alpha$ and $\beta_1$ are bounded by the eigenvalues of the filter and the desired tap fluctuation error. To keep the gain of taps M+1 to $N_{\mathit{ff}}$ of FFF 14, with respect to the noise, equivalent to the gain of FBF 20, with respect to the ISI, the LMS step size $\beta_2$ may be increased by a factor equal to the SNR. For example, assume the SNR at the input to slicer 26 is 30 decibels (dB), then $$\beta_2 = (10^{30/20}) \cdot \beta_1.$$

Adaptive DFE 12 represents only one embodiment of the invention; other embodiments exist. For example, the use of CE 32 is only one possible way of obtaining the noise or noise estimate. When other methods of obtaining the noise or noise estimate are used, the FFF tap update equations may be slightly modified, e.g., in terms of the time indices of the decision error and the noise estimate.

The invention may also be used with a fractionally-spaced FFF. In this case, the noise is estimated at the fractional sampling rate of the FFF. This can be done by utilizing multiple CE filters, each operating at the symbol rate, or one CE filter operating at the fractional sampling rate.

The invention is described here for a real, baseband communications system, however, it is also valid for a complex or passband system. The tap update equations may be slightly modified, in this case, to account for complex arithmetic and to include conjugation of the data.

Figure 3:
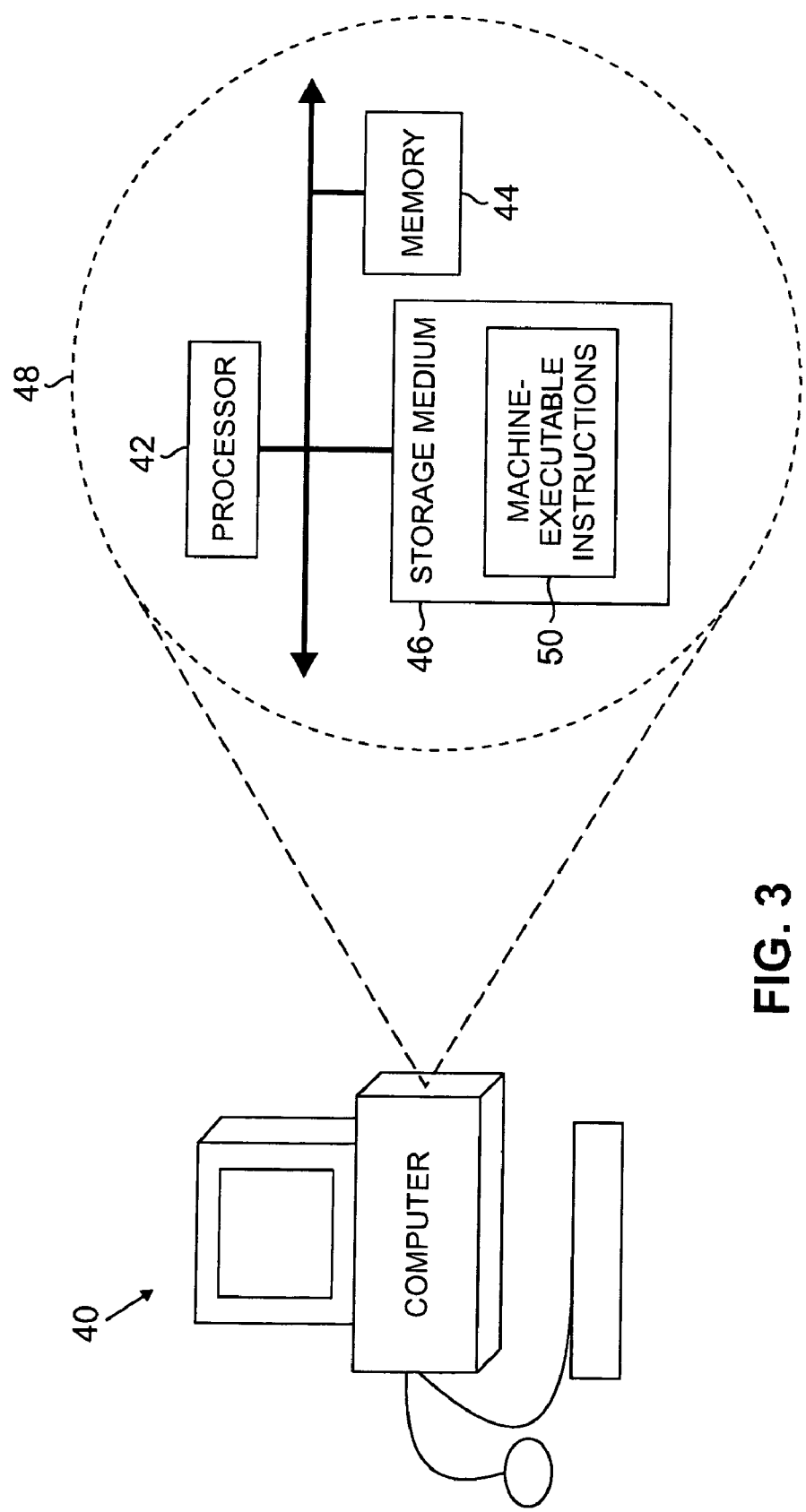
FIG. 3 is a view of a computer system on which coefficients for the feedforward filter may be determined.

The coefficients $b_k^i$, $d_k^i$ and $g_k^i$, described above, may be adaptively determined using hardware, e.g., discrete hardware components such as programmable logic gates, or software running on a computer. FIG. 3 shows a computer 40 on which the coefficients may be determined. Computer 40 includes a processor 42, a memory 44, and a storage medium 46 (see view 48). Storage medium 46 stores machine-executable instructions 50 that are executed by processor 42 out of memory 44 to adaptively determine the coefficients.

Although a personal computer is shown in FIG. 3, the invention is not limited to use with the hardware and software of FIG. 3. It may find applicability in any computing or processing environment. The coefficients may be determined using hardware, software, or a combination of the two. The coefficients may be determined using computer programs executing on programmable computers or other machines that each include a processor, a storage medium readable by the processor (including volatile and non-volatile memory and/or storage components), at least one input device, and one or more output devices. Program code may be applied to data entered using an input device (e.g., a mouse or keyboard) to determine the coefficients.

Each such program may be implemented in a high level procedural or object-oriented programming language to communicate with a computer system. However, the programs can be implemented in assembly or machine language. The language may be a compiled or an interpreted language.

Each computer program may be stored on a storage medium/article (e.g., CD-ROM, hard disk, or magnetic diskette) that is readable by a general or special purpose programmable computer for configuring and operating the computer when the storage medium or device is read by the computer to determine the coefficients. The coefficients may be determined using a machine-readable storage medium, configured with a computer program, where, upon execution, instructions in the computer program cause a machine to determine the coefficients.

The invention is not limited to the specific embodiments described above. For example, the invention is not limited to use with FIR filters or to use with the particular configuration shown in FIG. 2. The adaptive equalizer may be implemented in a single pair high speed digital subscriber line (HDSL2/G.SHDSL) system, or any other signal transmission system that requires reduction in ISI and colored noise.

Alternatively, the coefficients $b_k^i$ may be generated based on the input signal alone, i.e., not the noise. This is called the zeroforcing (ZF) criterion.

Other embodiments not described herein are also within the scope of the following claims.

What is claimed is:

1. A method of generating coefficients for use in an adaptive equalizer, the method comprising:
   generating first coefficients for use by the adaptive equalizer to reduce pre-cursor intersymbol interference in an input signal; and
   generating second coefficients for use by the adaptive equalizer to whiten noise in the input signal,
   wherein the first and second coefficients are used, respectively, in first and second sets of taps in a finite impulse response feedforward filter, the first coefficients are generated based on the input signal and noise, the second coefficients are generated based on an estimate of the noise, and the noise is estimated by subtracting a substantial replica of the input signal from a delayed version of the input signal and noise.

2. A method of generating coefficients for use in an adaptive equalizer, the method comprising:
   generating first coefficients for use by the adaptive equalizer to reduce pre-eursor intersymbol interference in an input signal; and
   generating second coefficients for use by the adaptive equalizer to whiten noise in the input signal,
   wherein the first coefficients, $b_k^j$, are generated as follows:

$b_k^i = b_{k-1}^i + \beta_1 \cdot E_k \cdot R_{k-i}$, for $i=1$ to $M$, where $i$ is an index of taps in a feedforward filter in the adaptive equalizer, $\beta_1$ is a step size of the feedforward filter, $E_k$ is an error signal generated by the adaptive equalizer, $R_{k-i}$ is the combined input signal and noise fed to the adaptive equalizer, and M is a number of taps in the feedforward filter between a first tap and a main tap.

3. A method of generating coefficients for use in an adaptive equalizer, the method comprising:
   generating first coefficients for use by the adaptive equalizer to reduce pre-cursor intersymbol interference in an input signal; and
   generating second coefficients for use by the adaptive equalizer to whiten noise in the input signal,
   wherein the second coefficients, $b_k^i$, are generated as follows:

$b_k^j = b_{k-1}^i + \beta_2 \cdot E_{k-L} \cdot V_{k-i-L}$, for $i=M+1$ to $N_{ff}$, where $i$ is an index of taps in a feedforward filter in the adaptive equalizer, $\beta_2$ is a step size of the feedforward filter, $E_{k-L}$ is a delayed error signal generated by the adaptive equalizer, $V_{k-i-L}$ is an estimate of noise fed to the adaptive equalizer, M is a number of taps in the feedforward filter between a first tap and a main tap, and $N_{ff}$ is a total number of taps in the feedforward filter.

4. An article comprising a machine-readable medium that stores instructions for generating coefficients for use in an adaptive equalizer, the instructions causing a machine to:
   generate first coefficients for use by the adaptive equalizer to reduce pre-cursor intersymbol interference in an input signal; and
   generate second coefficients for use by the adaptive equalizer to whiten noise in the input signal,
   wherein the first coefficients, $b_k^i$, are generated as follows:

$b_k^i = b_{k-1}^i + \beta_1 \cdot E_k \cdot R_{k-i}$, for $i=1$ to $M$, where $i$ is an index of taps in a feedforward filter in the adaptive equalizer, $\beta_1$ is a step size of the feedforward filter, $E_k$ is an eror signal generated by the adaptive equalizer, $R_{k-i}$ is the combined input signal and noise fed to the adaptive equalizer, and M is a number of taps in the feedforward filter between a first tap and a main tap.

5. An article comprising a machine-readable medium that stores instructions for generating coefficients for use in an adaptive equalizer, the instructions causing a machine to:
   generate first coefficients for use by the adaptive equalizer to reduce pre-cursor intersymbol interference in an input signal; and
   generate second coefficients for use by the adaptive equalizer to whiten noise in the input signal,
   wherein the second coefficients, $b_k^i$, are generated as fbllows:

$b_k^j = b_{k-1}^i + \beta_2 \cdot E_{k-L} \cdot V_{k-i-L}$, for $i=M+1$ to $N_{ff}$, where $i$ is an index of taps in a feedforward filter in the adaptive equalizer, $\beta_2$ is a step size of the feedforward filter, $E_{k-L}$ is a delayed error signal generated by the adaptive equalizer, $V_{k-i-L}$ is an estimate of noise fed to the adaptive equalizer, M is a number of taps in the feedforward filter between a first tap and a main tap, and $N_{ff}$ is a total number of taps in the feedforward filter.

6. An adaptive equalizer comprising circuitry which:
   generates first coefficients for use by the adaptive equalizer to reduce pre-cursor intersymbol interference in an input signal; and
   generates second coefficients for use by the adaptive equalizer to whiten noise in the input signal,
   wherein the first coefficients, $b_k^i$, are generated as follows:

$b_k^i = b_{k-1}^i + \beta_1 \cdot E_k \cdot R_{k-i}$, for $i=1$ to $M$, where $i$ is an index of taps in a feedforward filter in the adaptive equalizer, $\beta_1$ is a step size of the feedforward filter, $E_k$ is an error signal generated by the adaptive equalizer, $R_{k-i}$ is the combined input signal and noise fed to the adaptive equalizer, and M is a number of taps in the feedlbrward filter between a, first tap and a main tap.

7. An adaptive equalizer comprising circuitry which:
   generates first coefficients for use by the adaptive equalizer to reduce pre-cursor intersymbol interference in an input signal; and
   generates second coefficients for use by the adaptive equalizer to whiten noise in the input signal,
   wherein the second coefficients, $b_k^i$, are generated as follows:

$b_k^i = b_{k-1}^i + \beta_2 \cdot E_{k-L} \cdot V_{k-i-L}$, for $i=M+1$ to $N_{ff}$, where $i$ is an index of taps in a feedforward filter in the adaptive equalizer, $\beta_2$ is a step size of the fecdforward filter, $E_{k-L}$ is a delayed error signal generated by the adaptive equalizer, $V_{k-i-L}$ is an estimate of noise fed to the adaptive equalizer, M is a number of taps in the feedforward filter between a first tap and a main tap, and $N_{ff}$ is a total number of taps in the feedforward filter.

8. An adaptive equalizer which processes an input signal that includes noise, pre-cursor intersymbol interference, and post-cursor intersymbol interference, the adaptive equalizer comprising:
a feedforward filter which reduces the pre-cursor intersymbol interference and whitens the noise;
a feedback filter which obtains the post-cursor intersymbol interference in a signal that corresponds to the input signal;
circuitry which removes the post-cursor intersymbol interference froni the input signal; and
circuitry which estimates the noise by subtracting a substantial replica of the input signal from a delayed version of the input signal,
wherein the feedforward filter includes separate first and second coefficients, the first coefficients to reduce the pre-cursor intersymbol interference and the second coefficients to whiten the noise,
wherein the first and second coefficients are used, respectively, in first and second sets of taps of the feedforward filter, and
wherein the feedforward filter generates the first coefficients based on the input signal and the noise and generates the second coefficients based on an estimate of the noise.

9. An adaptive equalizer which processes an input signal that includes noise, pre-eursor intersymbol interference, and post-cursor intersymbol interference, the adaptive equalizer comprising:
a feedforward filter which reduces the pre-cursor intersymbol interference and whitens the noise;
a feedback filter which obtains the post-cursor intersynabol interference in a signal that corresponds to the input signal; and
circuitry which removes the post-cursor intersymbol interference from the input signal;
wherein the feedforward filter includes separate first and second coefficients, the first coefficients to reduce the pre-cursor intersymbol interference and the second coefficients to whiten the noise, and
wherein the first coefficients, $b_k^i$, are generated as follows:

$$b_k^i = b_{k-1}^i + \beta_1 \cdot E_k \cdot R_{k-i}, \text{ for } i=1 \text{ to } M,$$

where i is an index of taps in a feedforward filter in the adaptive equalizer, $\beta_1$ is a step size of the feedforward filter, $E_k$ is an error signal generated by the adaptive equalizer, $R_{k-i}$ is the combined input signal and noise fed to the adaptive equalizer, and M is a number of taps in the feedforward filter between a first tap and a main tap.

10. An adaptive equalizer which processes an input signal that includes noise, pre-cursor intersymbol interference, and post-cursor intersymbol interference, the adaptive equalizer comprising:
a feedforward filter which reduces the pre-cursor intersymbol interference and whitens the noise;
a feedback filter which obtains the post-cursor intersyinbol interference in a signal that corresponds to the input signal; and
circuitry which removes the post-cursor intersymbol interference from the input signal;
wherein the feedforward filter includes separate first and second coefficients, the first coefficients to reduce the pre-vursor intersyinbol interference and the second coefficients to whiten the noise, and
wherein the second coefficients, $b_k^i$, are generated as follows:

$$b_k^i = b_{k-1}^i + \beta_2 \cdot E_{k-L} \cdot V_{k-i-L}, \text{ for } i=M+1 \text{ to } N_{\mathit{ff}},$$

where i is an index of taps in a fecdforward filter in the adaptive equalizer, $\beta_2$ is a step size of the feedforward filter, $E_{k-L}$ is a delayed error signal generated by the adaptive equalizer, $V_{k-i-L}$ is an estimate of noise fed to the adaptive equalizer, M is a number of taps in the feedforward filter between a first tap and a main tap, and $N_{\mathit{ff}}$ is a total number of taps in the feedforward filter.

11. The adaptive equalizer of claim 8, wherein the adaptive equalizer comprises a single pair high speed digital subscriber line equalizer.

* * * * *

UNITED STATES PATENT AND TRADEMARK OFFICE
CERTIFICATE OF CORRECTION

PATENT NO. : 7,006,564 B2  Page 1 of 1
APPLICATION NO. : 09/930757
DATED : February 28, 2006
INVENTOR(S) : Ling et al.

It is certified that error appears in the above-identified patent and that said Letters Patent is hereby corrected as shown below:

In column 7, line 31, in Claim 2, delete "pre-eursor" and insert -- pre-cursor --, therefor.
In column 7, line 35, in Claim 2, delete "$b_k^j$," and insert -- $b_k^i$, --, therefor.
In column 7, line 53, in Claim 3, delete "$b_k^j$" and insert -- $b_k^i$ --, therefor.
In column 8, line 9, in Claim 4, delete "eror" and insert -- error --, therefor.
In column 8, line 23, in Claim 5, delete "fbllows:" and insert -- follows: --, therefor.
In column 8, line 25, in Claim 5, delete "$b_k^j$" and insert -- $b_k^i$ --, therefor.
In column 8, line 48, in Claim 6, delete "feedlbrward" and insert -- feedforward --, therefor.
In column 8, line 49, in Claim 6, after "between a" delete ",".
In column 8, line 62, in Claim 7, delete "fecdforward" and insert -- feedforward --, therefor.
In column 9, line 11, in Claim 8, delete "froni" and insert -- from --, therefor.
In column 9, line 27, in Claim 9, delete "pre-eursor" and insert -- pre-cursor --, therefor.
In column 9, lines 32–33, in Claim 9, delete "intersynabol" and insert -- intersymbol --, therefor.
In column 10, lines 16–17, in Claim 10, delete "intersyinbol" and insert -- intersymbol --, therefor.
In column 10, line 23, in Claim 10, delete "pre-vursor intersyinbol" and insert -- pre-cursor intersymbol --, therefor.
In column 10, line 29, in Claim 10, delete "fecdforward" and insert -- feedforward --, therefor.

Signed and Sealed this

Sixteenth Day of October, 2007

JON W. DUDAS
*Director of the United States Patent and Trademark Office*